(12) United States Patent
Saruyama et al.

(10) Patent No.: US 9,960,138 B2
(45) Date of Patent: *May 1, 2018

(54) CONNECTION BODY (71) Applicant: DEXERIALS CORPORATION, Tokyo (JP)

(72) Inventors: Kenichi Saruyama, Tochigi (JP); Yasushi Akutsu, Utsunomiya (JP)

(73) Assignee: DEXERIALS CORPORATION, Tokyo (JP)

(*) Notice: Subject to any disclaimer, the term of this patent is extended or adjusted under 35 U.S.C. 154(b) by 0 days. days.

This patent is subject to a terminal disclaimer.

(21) Appl. No.: 15/584,609

(22) Filed: May 2, 2017

(65) Prior Publication Data

US 2017/0236795 A1 Aug. 17, 2017

Related U.S. Application Data (63) Continuation of application No. 15/114,453, filed as application No. PCT/JP2015/052920 on Feb. 3, 2015, now Pat. No. 9,673,168.

(30) Foreign Application Priority Data

Feb. 3, 2014 (JP) ................................ 2014-018532

(51) Int. Cl.
*H01L 23/00* (2006.01)
(52) U.S. Cl.
CPC ............. *H01L 24/14* (2013.01); *H01L 24/13* (2013.01); *H01L 24/16* (2013.01); *H01L 24/27* (2013.01);
(Continued)
(58) Field of Classification Search
None
See application file for complete search history.

(56) References Cited

U.S. PATENT DOCUMENTS 5,844,314 A 12/1998 Kim
2002/0098620 A1* 7/2002 Ding ............... H01L 21/563
438/113
(Continued)

FOREIGN PATENT DOCUMENTS

JP 2004-214374 7/2004
JP 2005-203758 A 7/2005
(Continued)

OTHER PUBLICATIONS

Apr. 28, 2015 International Search Report issued in International Patent Application No. PCT/JP2015/052920.

*Primary Examiner* — Khaja Ahmad
(74) *Attorney, Agent, or Firm* — Oliff PLC (57) ABSTRACT

Even in case of conductive particles being clamped between stepped sections of substrate electrodes and electrode terminals, conductive particles sandwiched between each main surface of the substrate electrodes and electrode terminals are sufficiently compressed, ensuring electrical conduction. An electronic component is connected to a circuit substrate via an anisotropic conductive adhesive agent, on respective edge-side areas of substrate electrodes of the circuit substrate and electrode terminals of the electronic component, stepped sections are formed and abutted, conductive particles are sandwiched between each main surface and stepped sections of the substrate electrodes and electrode terminals; the conductive particles and stepped sections satisfy formula, $a+b+c \leq 0.8\,D$ (1), wherein a is height of the stepped section of the electrode terminals, b is height of the stepped section of the substrate electrodes, c is gap distance between each stepped sections and D is diameter of conductive particles.

13 Claims, 5 Drawing Sheets (52) U.S. Cl.
CPC .............. *H01L 24/29* (2013.01); *H01L 24/32* (2013.01); *H01L 24/73* (2013.01); *H01L 24/81* (2013.01); *H01L 24/83* (2013.01); *H01L 2224/13019* (2013.01); *H01L 2224/13082* (2013.01); *H01L 2224/16225* (2013.01); *H01L 2224/73204* (2013.01); *H01L 2224/81903* (2013.01); *H01L 2224/8313* (2013.01); *H01L 2224/83101* (2013.01); *H01L 2224/83132* (2013.01); *H01L 2224/83192* (2013.01); *H01L 2224/83203* (2013.01)

(56) References Cited

U.S. PATENT DOCUMENTS

| | | |
|---|---|---|
| 2005/0104225 A1 | 5/2005 | Huang |
| 2006/0202334 A1* | 9/2006 | Kwon ................. H01L 23/3114 257/737 |
| 2006/0280912 A1* | 12/2006 | Liang ...................... H01B 1/22 428/173 |
| 2007/0045841 A1* | 3/2007 | Cho .................... H01L 23/3171 257/737 |
| 2008/0042180 A1 | 2/2008 | Yamazaki et al. |
| 2011/0068346 A1* | 3/2011 | Lee ..................... H01L 27/3276 257/72 |
| 2014/0217450 A1* | 8/2014 | Ishigami .................. H01B 1/22 257/98 |
| 2014/0367707 A1* | 12/2014 | Meng .................. H01L 27/3253 257/88 |

FOREIGN PATENT DOCUMENTS

| | | |
|---|---|---|
| JP | 2007-067134 A | 3/2007 |
| JP | 2011-012180 A | 1/2011 |
| JP | 4789738 B2 | 10/2011 |

\* cited by examiner

CONNECTION BODY

CROSS-REFERENCE TO RELATED APPLICATIONS

This is a Continuation of application Ser. No. 15/114,453 filed Jul. 27, 2016, which is a National Phase of Application No. PCT/JP2015/052920 filed Feb. 3, 2015, which claims priority to Japanese Patent Application No. 2014-018532 filed on Feb. 3, 2014. The disclosure of the prior applications is hereby incorporated by reference herein in its entirety.

TECHNICAL FIELD

The present disclosure relates to a connection body in which an electronic component is connected to a circuit substrate, and more particularly relates to connection body in which an electronic component is connected to a circuit substrate via an adhesive agent containing conductive particles.

BACKGROUND ART

Conventionally, devices such as televisions, PC monitors, mobile phones, smart phones, portable game devices, tablet devices, wearable devices and automotive monitors, among others, have used a liquid crystal display device or an organic EL panel as a display means. In recent years, in such display devices, in view of finer pitches and thinner and lighter devices, mounting of driver ICs directly onto glass substrates of display panels, which is known as COG (chip on glass), has been employed.

Figure 7A:
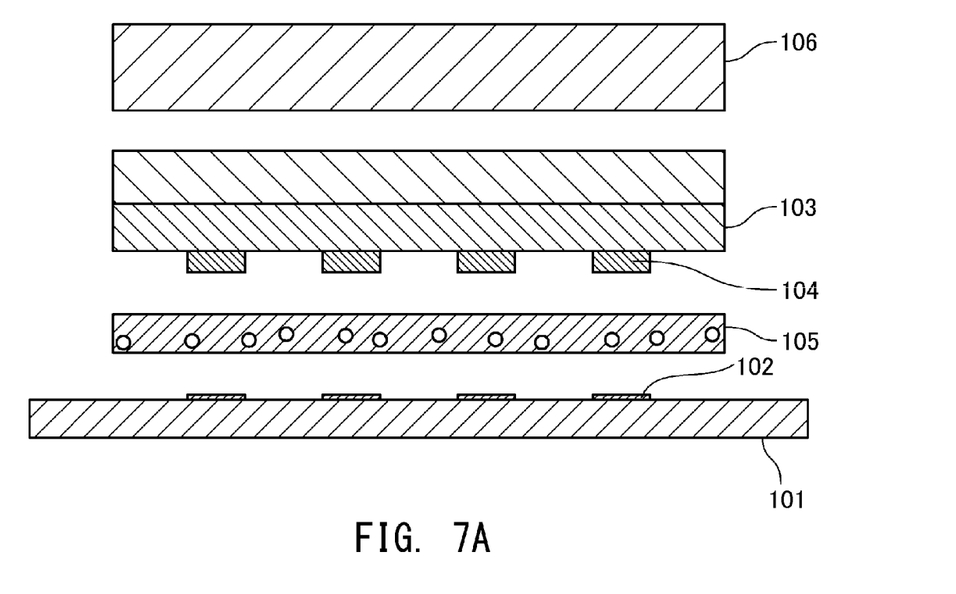
Figure 7B:
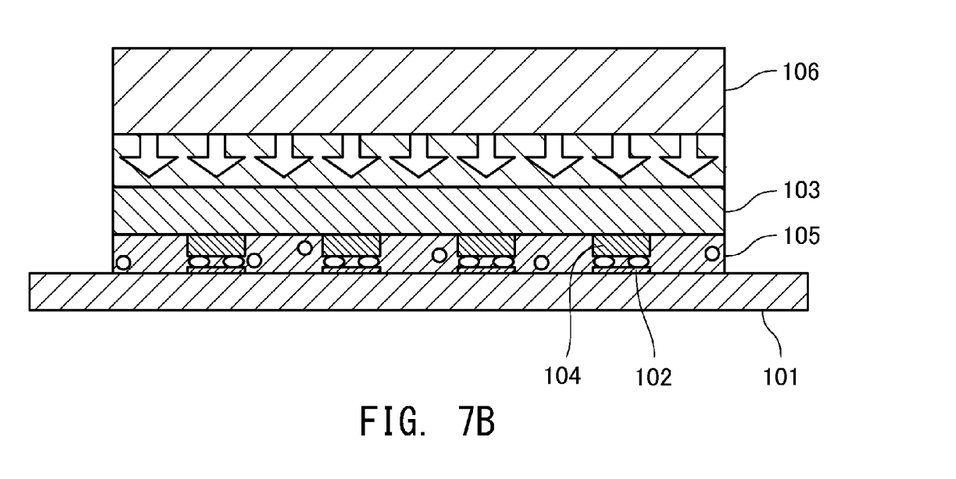

For example, in a liquid crystal display panel in which COG mounting is employed, as shown in FIG. 7A and FIG. 7B, a plurality of transparent electrodes 102 made from, among other materials, ITO (indium tin oxide), are formed onto a transparent substrate 101 made from, for example, a glass substrate, and an electronic component such as a liquid crystal driver IC 103 is connected onto these transparent electrodes 102. The liquid crystal driver IC 103 has electrode terminals 104 corresponding to the transparent electrodes 102 formed onto the mounting surface thereof and is thermocompression-bonded onto the transparent substrate 101 via an anisotropic conductive film 105, thereby connecting the electrode terminals 104 to the transparent electrodes 102.

The anisotropic conductive film 105 contains a binder resin into which conductive particles are dispersed and is film-formed, and by being thermocompression-bonded between two conductors, electrical conduction between the conductors is achieved by the conductive particles and mechanical connection between the conductors is ensured between the conductors by the binder resin. The adhesive agent constituting the anisotropic conductive film 105, although typically a highly reliable thermosetting binder resin is used, may be a photosetting binder resin or a thermo/photosetting binder resin.

In the case of connecting the liquid crystal driver IC 103 to the transparent electrodes 102 via such an anisotropic conductive film 105, the anisotropic conductive film 105 is first temporarily bonded onto the transparent electrodes 102 of the transparent substrate 101 by a temporary pressure bonding means which is not illustrated in the drawings. After mounting the liquid crystal driver IC 103 onto the transparent substrate 101 via the anisotropic conductive film 105 to form a temporary connection body, a thermocompression bonding means, for example, a thermocompression bonding head 106, is used to hot-press the liquid crystal driver IC 103 along with the anisotropic conductive film 105 towards the transparent substrate 102. Heat applied by the thermocompression bonding head 106 causes a thermosetting reaction in the anisotropic conductive film 105, thereby connecting the liquid crystal driver IC 103 onto the transparent electrodes 102.

PRIOR ART LITERATURE

Patent Literatures

PLT 1: Japanese Patent No. 4789738
PLT 2: Japanese Unexamined Patent Application Publication No. 2004-214374
PLT 3: Japanese Unexamined Patent Application Publication No. 2005-203758

SUMMARY OF THE INVENTION

Problem to be Solved by the Invention

In recent years, along with size reductions and precision increases in liquid crystal displays and other electronic devices, advancements have been made in finer pitches such as in pitches for circuit substrate wiring and connecting terminals of electronic components. In the case of using an anisotropic conductive film to COG connect an electronic component such as an IC chip to a circuit substrate having a reduced pitch, in order both to ensure conduction by certainly trapping conductive particles between electrode terminals and substrate electrodes which are narrowed and size-reduced as well as prevent inter-terminal short circuits caused by the conductive particles being continuous between narrowed and size-reduced electrode terminals, anisotropic conductive films have been used in which conductive particles having a small diameter are filled at a high density.

Furthermore, in the circuit substrate, in order to prevent mechanical damage and short circuits, a protective film is formed on the substrate surface. On the substrate electrodes formed on the substrate surface, stepped sections are formed by generation of the protective film on edge-side areas. Furthermore, on the electronic component such as an IC chip, stepped sections are also formed on edge-side areas of the electrode terminals which are made of metal. Thus, in the substrate electrodes and the electrode terminals, the stepped sections are raised around main surfaces which are flat.

When connecting the electronic component to the circuit substrate, the stepped sections of the substrate electrodes and the stepped sections of the electrode terminals are abutted and connected. At this time, if conductive particles are present between the stepped sections of the substrate electrodes and the stepped sections of electrode terminals, by the conductive particles being clamped between the stepped sections on both sides, the conductive particles between main surfaces of the substrate electrodes and the electrode terminals have not been sufficiently deformed, which might lead to a loss of electrical conduction. Furthermore, the stepped sections on the substrate electrodes have a low electrical conduction due to being formed by the protective film, and it is not possible to ensure conduction by the conductive particles clamped between the stepped sections on both sides. Still further, when the diameter of the conductive particles is reduced, insufficient compression of the conductive particles caused by the conductive particles being clamped between each of the stepped sections of the substrate electrodes and the electrode terminals appears more prominently.

In an attempt to cope with finer pitches in circuit-substrate wiring and electrode terminals of electronic components, anisotropic conductive films have been proposed in which conductive particles are regularly arranged; however, by having the conductive particles in a regular arrangement, although capable of ensuring entrapment of the conductive particles between each of the main surfaces of the substrate electrodes and the electrode terminals, there are cases in which clamping of the conductive particles between each of the stepped sections can easily occur.

Thus, an object of the present invention is to provide a connection body of a circuit substrate and an electronic component in which, even in the case of conductive particles being clamped between a stepped section of a substrate electrode and a stepped section of an electrode terminal, conductive particles trapped between each main surface of the substrate electrodes and the electronic terminals can be sufficiently compressed and electrical conduction can be ensured.

Solution to Problem

In order to solve the aforementioned problems, a connection body according to the present disclosure comprises a circuit substrate; and an electronic component connected onto the circuit substrate via an anisotropic conductive adhesive agent; wherein the circuit substrate has substrate electrodes formed thereon and the electronic component has electrode terminals formed thereon, both of which having stepped sections formed on respective edge-side areas; wherein conductive particles contained by the anisotropic conductive adhesive agent are sandwiched between main surfaces of the substrate electrodes and the electrode terminals and between the stepped sections formed on the respective edge-side areas of the substrate electrodes and the electrode terminals; wherein the conductive particles and each of the stepped sections of the substrate electrodes and the electrode terminals satisfy the following formula (1).

$$a+b+c \leq 0.8D \quad (1)$$

In Formula (1), a is a height of the stepped section of the electrode terminal, b is a height of the stepped section of the substrate electrode, c is a gap distance between each of the stepped sections and D is a diameter of the conductive particles.

Advantageous Effects of Invention

According to the present disclosure, the conductive particles trapped between both main surfaces of the substrate electrodes and the electrode terminals can be compressed to reduce diameter to at least 80%, thus enabling assurance of sufficient electrical conduction.

BRIEF DESCRIPTION OF DRAWINGS

FIG. 7 is a cross sectional view illustrating a process in which an IC chip is connected to a transparent substrate of a liquid crystal display panel in FIG. 7A the process before connection and FIG. 7B the process during connection.

DESCRIPTION OF EMBODIMENTS

Hereinbelow, the connection body according to the present disclosure will now be more particularly described with reference to the accompanying drawings. It should be noted that the present disclosure is not limited to the embodiments described below and various modifications can be made without departing from the scope of the present invention. The features shown in the drawings are illustrated schematically and are not intended to be drawn to scale. Actual dimensions should be determined in consideration of the following description. Moreover, those skilled in the art will appreciate that dimensional relations and proportions may be different among the drawings in some parts.

Liquid Crystal Display Panel

Figure 1:
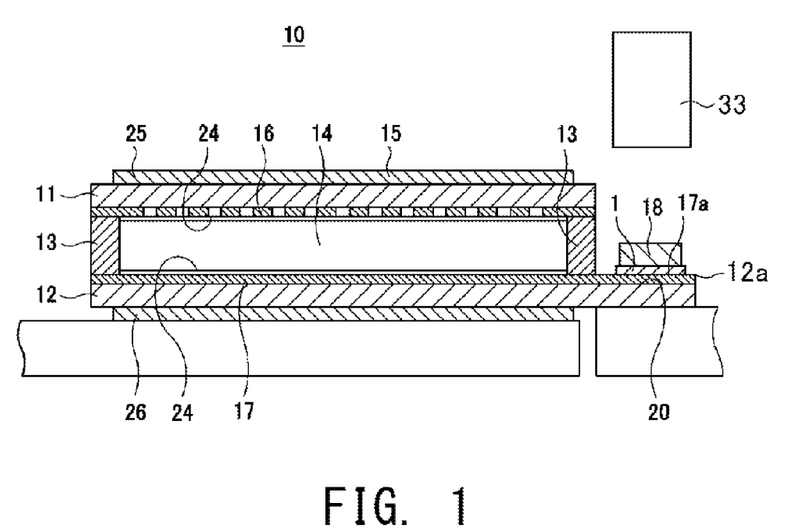
FIG. 1 is a cross-sectional view illustrating one example of a connection body of a liquid crystal display panel.

In the following, a liquid crystal display panel will be described as an example in which, as a connection body according to the present disclosure, a liquid crystal driver IC is mounted as an electronic component onto a glass substrate. As illustrated in FIG. 1, in a liquid crystal display panel 10, two transparent substrates 11, 12 made from a material such as a glass substrate are arranged to face each other and these transparent substrates 11, 12 are joined together by a seal 13 which is frame-shaped. In the liquid crystal display panel 10, a panel display component 15 is formed by sealing a liquid crystal 14 within a space enclosed by the transparent substrates 11, 12.

On both inner surfaces of the transparent substrates 11, 12 opposing each other, a pair of transparent electrodes 16, 17 are formed from, for example, ITO (indium tin oxide) in a stripe pattern in mutually intersecting directions. Both of the transparent electrodes 16, 17 are configured so that a pixel, as the minimum unit of the liquid crystal display, is constituted by intersecting portions of both of the transparent electrodes 16, 17.

Among both of the transparent substrates 11, 12, one transparent substrate 12 is formed to be larger than the other transparent substrate 11 in planar dimensions, and in an edge area 12a of the transparent substrate 12 formed to be larger, a COG mounting portion 20 is provided on which a liquid crystal driver IC 18 is mounted as the electronic component. It should be noted that, on the COG mounting portion 20, terminal portions 17a of the transparent electrodes 17 and a substrate-side alignment mark 21, which is to be superimposed with an IC-side alignment mark 22 provided on the liquid crystal driver IC 18, are formed.

Terminal Portion

Figure 2:
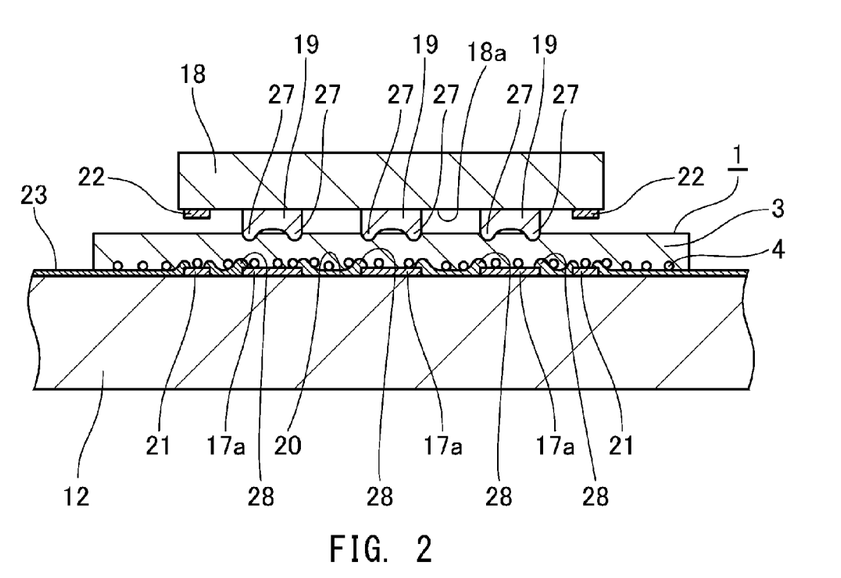
FIG. 2 is a cross-sectional view illustrating a connecting step of a liquid crystal driver IC and a transparent substrate.

As illustrated in FIG. 2, in the transparent substrate 12, in order to prevent physical damage and short circuits, an electrically insulating protective film 23 comprises an inorganic film or an organic film, for example, a nitride film or a silicon oxide film, and is formed on the substrate surface. The protective film 23 is formed in areas excluding the terminal portions 17a and substrate-side alignment mark 21 by using known film formation methods. A stepped section 28 is thus formed by the protective film 23 on edge-side areas of the terminal portions 17a that are adjacent to the protective film 23. Therefore, when viewed in cross-section, the stepped sections 28 on both edge-side areas of the terminal portions 17a are raised and the main surface is flat.

The liquid crystal driver IC 18, by selectively applying a liquid crystal driving voltage to the pixel, can partially change liquid crystal orientation to perform a selected liquid crystal display. As illustrated in FIG. 2, the liquid crystal driver IC 18 has a mounting surface 18a which faces the transparent substrate 12 and on which electrode terminals 19 (bumps) are formed for electrically connecting to terminal portions 17a of the transparent substrate 17. Suitable examples usable as the electrode terminals 19 include copper bumps, gold bumps and gold-plated copper bumps, among others.

Electrode Terminal

Figure 3:
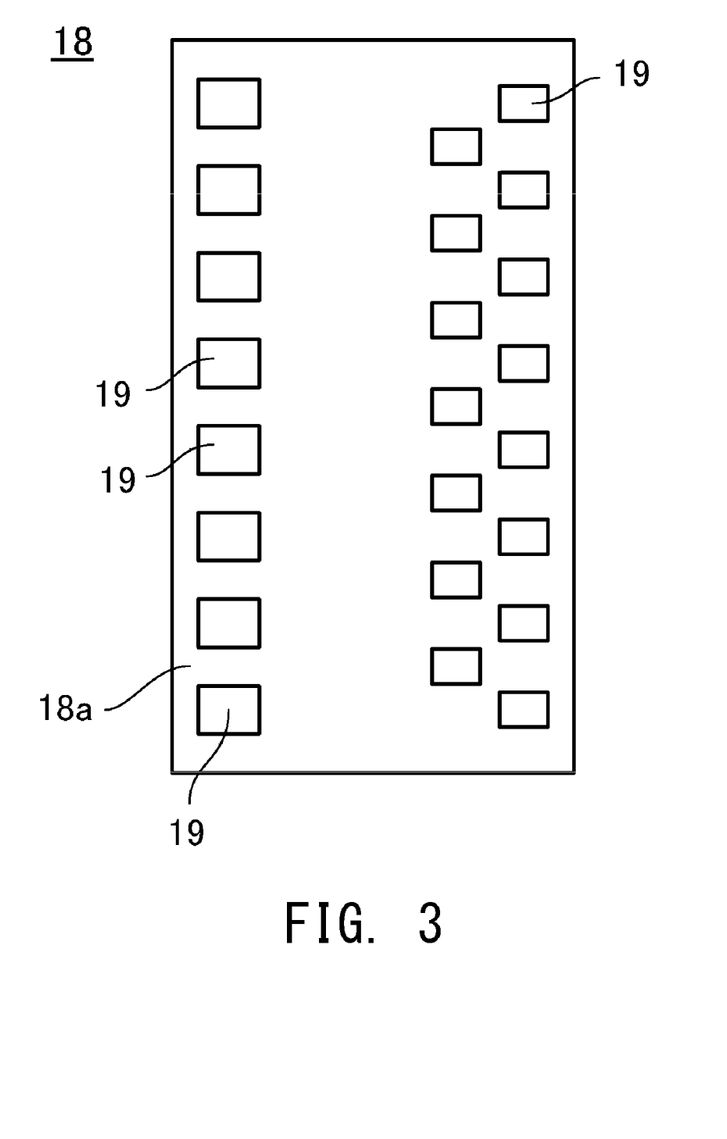
FIG. 3 is a plan view illustrating electrode terminals (bumps) and an inter-terminal space of a liquid crystal driver IC.

In the liquid crystal driver IC 18, for example, as illustrated in FIG. 3, the electrode terminals 19 (input bumps) are arranged in a single line along one edge side of the mounting surface 18a and the electrode terminals 19 (output bumps) are arranged in a staggered fashion in multiple rows along another edge side that is opposite to the one edge side. The transparent electrodes 19 and the terminal portions 17a formed on the COG mounting portion 20 of the transparent substrate 12 are formed in equal number at equal pitch and are connected by positioning and connecting the transparent substrate 12 and the liquid crystal driver IC 18.

It should be noted that, recently, along with size reductions and advanced functionality in liquid crystal displays and other electronic devices, size reductions and height reductions are desired in electronic components such as the liquid crystal driver IC 18 and height of the terminal electrodes 19 is also reduced (to, for example, 6 to 15 μm).

As illustrated in FIG. 2, in the electrode terminals 19, stepped sections 27 are formed on both edge-side areas. Because the stepped sections 27 are made at the time of manufacturing the electrode terminals 19 which are made of metal, when viewed in cross-section, in the electrode terminals 19, both edge-side areas are raised and main surfaces area flat.

In the liquid crystal driver IC 18, by anisotropic conductive connection in the COG mounting portion 20, the stepped sections 28 formed on both edge-side areas of the electrode terminals 19 and the stepped sections 27 formed on both edge-side areas of the terminal portions 17a are abutted. At this time, between both sides of the stepped sections 27, 28 of the terminal portions 17a and the electrode terminals 19, the particles 4 are clamped so that both sides oppose each other with a certain gap. Furthermore, by pressing the liquid crystal driver IC 18 with a thermocompression head 33, the conductive particles 4 clamped between both sides of the stepped sections 27, 28 are significantly deformed or destroyed between both sides of the stepped sections 27, 28.

Thus, each of the main surfaces of the terminal portions 17a and the electrode terminals 19 face each other at a distance equal to the height of the stepped sections 27, 28 on both sides plus the diameter of the conductive particles 4 clamped between the stepped sections 27, 28 on both sides when compressed (or destroyed). Moreover, the height of the stepped sections 27 is the distance in the normal direction between the main surfaces of the terminal portions 17a to the top of the stepped sections 27 and the height of the stepped sections 28 is the distance in the normal direction between the main surfaces of the electrode terminals 19 and the top of the stepped sections 28.

Furthermore, on the mounting surface 18a of the liquid crystal driver IC 18, an IC-side alignment mark 22 is formed for performing alignment with respect to the transparent substrate 12 by superimposing with the substrate-side alignment mark 21. It should be noted that, due to progress in finer wiring pitches for the transparent electrodes 17 of the transparent substrate 12 and finer pitches of the electrode terminals 19 of the liquid crystal driver IC 18, a high accuracy is desired in alignment of the liquid crystal driver IC 18 and the transparent substrate 12.

As the substrate-side alignment mark 21 and the IC-side alignment mark 22, a variety of marks can be used which can be combined together to align the transparent substrate 12 and the liquid crystal driver IC 18.

On the terminal portions 17a of the transparent electrodes 17 formed on the COG mounting portion 20, the liquid crystal driver IC 18 is connected using an anisotropic conductive film 1 as a circuit connecting-use adhesive agent. The anisotropic conductive film 1 contains the conductive particles 4 and is for electrically connecting, via the conductive particles, the electrode terminals 19 of the liquid crystal driver IC 18 to the terminal portions 17a of the transparent electrodes 17 formed on the edge area 12a of the transparent substrate 12. In the anisotropic conductive film 1, thermocompression bonding with the thermocompression bonding head 33 causes the binder resin to flow, deforms the conductive particles 4 between the terminal portions 17a and the electrode terminals 19 of the liquid crystal driver IC 18 and cures the binder resin in this state. The anisotropic conductive film 1 thus mechanically and electrically connects the transparent substrate 12 and the liquid crystal driver IC 18.

Further, on both the transparent electrodes 16, 17, an orientation film 24 that is subjected to a predetermined rubbing treatment is formed and an initial orientation of the liquid crystal molecules is regulated by this orientation film 24. Still further, a pair of polarizing plates 25, 26 are disposed on the outer surfaces of the transparent substrates 11, 12; these polarizing plates 25, 26 regulate the wave-direction of transmitted light from a light source such as a backlight (not illustrated).

Anisotropic Conductive Film

Figure 4:
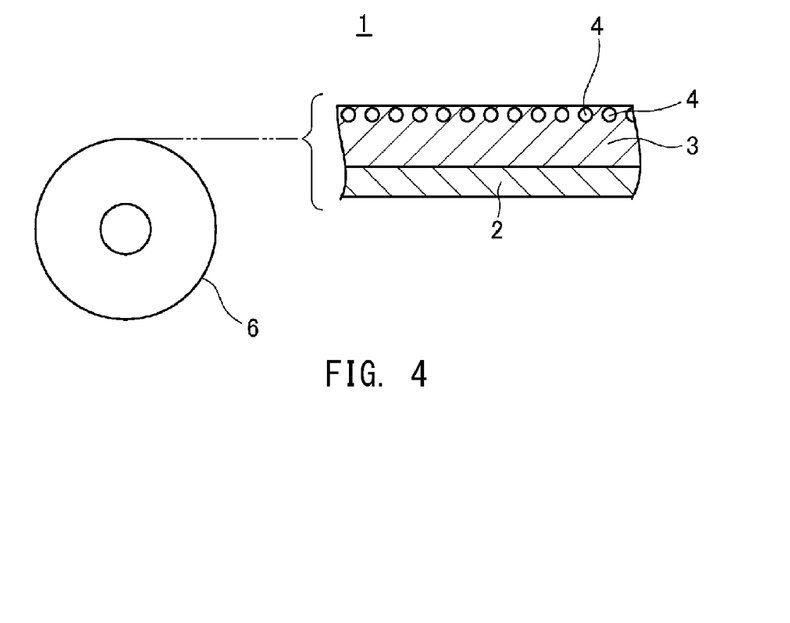
FIG. 4 is a cross-sectional view illustrating an anisotropic conductive film.

Next, the anisotropic conductive film 1 will be described. In the anisotropic conductive film (ACF) 1, as illustrated in FIG. 4, typically, the binder resin layer (adhesive agent layer) 3 containing the conductive particles 4 is formed on a release-treated film 2 serving as a base material. The anisotropic conductive film 1 is an adhesive agent of a thermosetting-type or a photocurable-type such as by ultraviolet light and is pasted onto the transparent electrodes 17, which are formed on the transparent substrate 12 of the liquid crystal display panel 10, along with mounting the liquid crystal driver IC 18; flowing is caused by thermocompression-bonding by the thermocompression bonding head 33 and the conductive particles 4 are deformed between the terminal portions 17a of the respectively opposing transparent electrodes 17 and the electrode terminals 19 of the liquid crystal driver IC 18; heat is then applied or ultraviolet light is irradiated in order to cure the resin in a state in which the conductive particles are deformed. The anisotropic conductive film 1 is thus able to connect and conduct electricity between the transparent substrate 12 and the liquid crystal driver IC 18.

Further, the anisotropic conductive film 1 has a normal binder resin layer 3 containing a film-forming resin, a thermosetting resin, a latent curing agent, a silane coupling agent, among others, and also has the conductive particles 4. As illustrated in FIG. 4, the conductive particles 4 in the binder resin layer 3 are preferably regularly arranged in a predetermined pattern.

The release-treated film 2 for supporting the binder resin layer is formed by coating, for example, PET (polyethylene terephthalate), OPP (oriented polypropylene), PMP (poly-4-methylpentene-1), PTFE (polytetrafluoroethylene), among others, with a release agent such as silicone, and is for preventing drying of the anisotropic conductive film 1 and maintaining the shape of the anisotropic conductive film 1.

As the film-forming resin contained by the binder resin layer 3, a resin having an average molecular weight of approximately 10,000 to 80,000 is preferably used. Examples of film forming resin include epoxy resin, modified epoxy resin, urethane resin and phenoxy resin, among a wide variety of other resins. Among these, in view of such properties as resin-formed states and connection reliability, a phenoxy resin is particularly preferable.

Examples of thermosetting resins, without particular limitation, include commercially available epoxy resins and acrylic resins.

Examples of epoxy resin include, without particular limitation, naphthalene-type epoxy resin, biphenol-type epoxy resin, phenol-novolac type epoxy resin, bisphenol type epoxy resin, stilbene-type epoxy resin, triphenolmethane-type epoxy resin, phenol aralkyl-type epoxy resin, naphthol-type epoxy resin, dicyclopentadiene-type epoxy resin and triphenylmethane-type epoxy resin, among others. These may be used individually or in a combination of two or more.

Acrylic resin is without particular limitation and an acrylic compound and/or a liquid acrylate, among others, may be selected as appropriate according to purpose. Examples include methyl acrylate, ethyl acrylate, isopropyl acrylate, isobutyl acrylate, epoxy acrylate, ethylene glycol diacrylate, diethylene glycol diacrylate, trimethylol propane triacrylate, dimethylol tricyclodecane diacrylate, tetramethylene glycol tetraacrylate, 2-hydroxy-1,3-diacryloxy propane, 2,2-bis[4-(acryloxy) phenyl] propane, 2,2-bis[4-(acryloxy ethoxy) phenyl] propane, dicyclopentenyl acrylate, tricyclodecanyl acrylate, tris(acryloxyethyl) isocyanurate, urethane acrylate and epoxy acrylate, among others. It should be noted that methacrylate may be substituted for acrylate. These may be used individually or in a combination of two or more.

The latent curing agent is without particular limitation and examples include thermosetting and UV-curing types, among a variety of other types of curing agents. The latent curing agent does not react under normal conditions and a trigger including heat, light and/or pressure, among others, for activation/initiating a reaction can be selected according to need. Existing methods for activating a heat activated latent curing agent include methods in which active species (cations, anions and/or radicals) are generated by a dissociative reaction due to heat, methods in which the curing agent is stably dispersed in the epoxy resin, the curing agent becomes compatible with and dissolves in the epoxy resin at high temperatures and the curing reaction is initiated, methods in which a molecular sieve enclosed type curing agent is dissolved at a high temperature to initiate the curing reaction and methods in which microcapsules are dissolved to cure, among other methods. Examples of latent curing agents include imidazole-type, hydrazide-type, boron trifluoride-amine complexes, sulfonium salt, aminimide, polyamine salt and dicyandiamide, among others, and modified compounds of these; these may be used individually or in a combination of two or more. Among these, a microcapsule imidazole-type latent curing agent is particularly suitable.

The silane coupling agent is without particular limitation and examples include epoxy-type, amino-type, mercapto/sulfide-type, and ureido-type, among others. By adding the silane coupling agent, adhesion properties at interfaces between organic and inorganic materials can be improved.

Conductive Particles

Examples of conductive particles 4 usable in the anisotropic conductive film 1 include known conductive particles used in anisotropic conductive films. As the conductive particles 4, examples include particles of metals or metal alloys such as those of nickel, iron, copper, aluminum, tin, lead, chromium, cobalt, silver or gold and particles such as those of metal oxides, carbon, graphite, glass, ceramics and plastics coated with metal, or the above-mentioned particles further coated with a thin electrically-insulating film, among others. In the case of coating a metal to the surface of resin particles, examples of usable resin particles include phenol resin, acrylic resin, acrylonitrile-styrene (AS) resin, benzoguanamine resin, divinylbenzene-type resin and styrene-type resin particles, among others.

Regular Arrangement of Conductive Particles

Figure 5:
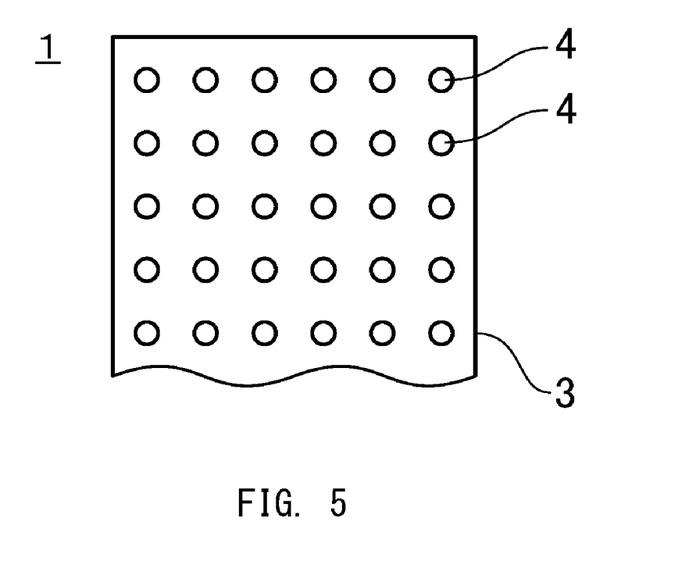
FIG. 5 is a plan view illustrating an anisotropic conductive film in which conductive particles are regularly arranged in a grid pattern.

In the anisotropic conductive film 1, the conductive particles 4 are preferably arranged in a regular pattern as viewed from a planar perspective, for example as illustrated in FIG. 5, a uniformly spaced grid. By arranging the conductive particles 4 regularly in a planer perspective, in contrast with the case of randomly dispersing the conductive particles 4, even in the case of a reduced pitch between adjacent terminals and a reduced and narrowed inter-electrode surface area for the electrode terminals 19 of the liquid crystal driver IC 18 and the conductive particles 4 are filled at a high density, in the connecting step of the liquid crystal driver IC 18, the anisotropic conductive film 1 can prevent short circuits between the electrode terminals 19 caused by agglomeration of the conductive particles 4.

Further, regularly arranging the conductive particles 4 in the anisotropic conductive film 1 prevents variations in density due to aggregation of the conductive particles 4, even in the case of filling the binder resin layer 3 at a high density. Therefore, with the anisotropic conductive film 1, the conductive particles 4 can be trapped even in the case of the terminal portions 17a and the electrode terminals 19 having reduced pitches. The uniformly spaced pattern arrangement of the conductive particles 4 can be, for example, a grid pattern as viewed from a planar perspective. The connecting step of the liquid crystal driver IC 18 is described in detail further below.

Such an anisotropic conductive film 1 can be manufactured by methods including, for example, methods of coating a pressure-sensitive adhesive agent onto a stretchable sheet and arranging the conductive particles 4 in a single layer before stretching the sheet to a selected draw ratio, methods of adjusting the conductive particles 4 into a selected pattern on a matrix material and subsequently transferring the conductive particles 4 to the binder resin layer 3 which is supported by the release-treated film, and methods of supplying the conductive particles 4 via an arrangement plate having openings corresponding to the pattern.

It should be noted that the shape of the anisotropic conductive film 1 is without particular limitation, and, for example, as illustrated in FIG. 4, can be a long, tape shape that is windable around a winding reel 6, enabling use by simply cutting to a predetermined length.

In the embodiment described above, as an example, as the anisotropic conductive film 1, a film-formed adhesive film made from a thermosetting resin composition containing the binder resin layer 3 in which the conductive particles 4 were dispersed is described; however, the adhesive agent according to the present disclosure is not limited thereto, and, for example, a configuration is possible in which an insulating adhesive agent layer containing the binder resin 3 alone is laminated with a conductive particle-containing layer containing the binder resin 3 which contains the conductive particles 4 in a regular arrangement. Furthermore, in the anisotropic conductive film 1, in the case of regularly arranging the conductive particles 4 as viewed from a planar perspective, in addition to being arranged in a single layer as illustrated in FIG. 4, the conductive particles may be regularly arranged as viewed from a planar perspective in a plurality of binder resin layers 3. Still further, in at least one layer of a multilayer structure of the anisotropic conductive film 1, the conductive particles 4 may be dispersed at a single, selected distance.

Figure 6:
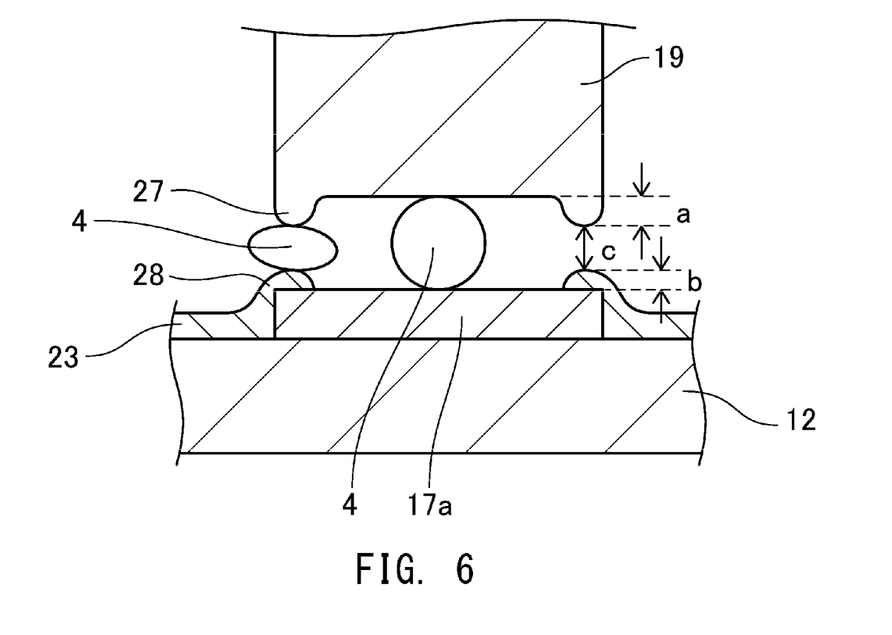
FIG. 6 is a cross-sectional view illustrating a substrate electrode and an electrode which are sandwiching conductive particles.

Relationship Between Heights of Conductive Particles and Substrate Electrode and Electrode Terminal Stepped Sections In the case of using an anisotropic conductive film 1 in which the conductive particles 4 are regularly arranged, as illustrated in FIG. 6, there are cases in which the conductive particles 4 are clamped between the stepped sections 27, 28 of the electrode terminals 19 and the terminal portions 17a. At this time, the conductive particles 4, and the stepped sections 27, 28 of the electrode terminals 19 and the terminal portions 17a sandwiching the conductive particles 4, satisfy the following Formula (1);

$$a+b+c \leq 0.8D \tag{1},$$

wherein a is a height of the stepped section of the electrode terminals 19, b is a height of the stepped section of the terminal portions 17a, c is a gap distance between each of the stepped sections and D is a diameter of the conductive particles.

By satisfying Formula (1), in the liquid crystal display panel 10, the conductive particles 4 sandwiched between both main surfaces of the terminal portions 17a and the electrode terminals 19 can be compressed to reduce diameter to at least 80%, thus enabling assurance of sufficient electrical conduction.

Thus, in the liquid crystal display panel, by connecting the liquid crystal driver IC 18 via the anisotropic conductive film 1, the conductive particles 4 are clamped between the stepped section 27 of the electrode terminals 19 and the stepped section 28 of the terminal portions 17. At this time, distance between both main surfaces of the terminal portions 17a and the electrode terminals 19 is a distance of the sum (a+b+c) of the height a of the stepped sections of the electrode terminals 19, the height b of the stepped sections of the terminal portions 17a, and a gap c caused by clamping of the conductive particles 4 between both sides of the stepped sections 27, 28. Therefore, by the distance (a+b+c) between the main surfaces of both sides of the terminal portions 17a and the electrode terminals 19 being at most 80% of the diameter D of the conductive particles 4, the conductive particles 4 can be pressed at least until compressing to a diameter of 80%.

In contrast, in the case in which Formula (1) is not satisfied, by the conductive particles 4 being clamped between the stepped sections 27 of the electrode terminals 19 and the stepped sections 28 of the terminal portions 17a, distance between both of the main surfaces of the terminal portions 17a and the electrode terminals 19 is, even at a minimum, greater than 80% of the diameter of the conductive particles 4 which leads to compression ratio of the conductive particles 4 being less than 20% and pressing is insufficient. Consequently, conduction between the terminal portions 17a and the electrode terminals 19 might be degraded.

Moreover, in the present disclosure, the following Formula (2) may be satisfied.

$$c \leq 1 \ \mu m \tag{2}$$

As represented in Formula (2), the conductive particles 4 clamped between the stepped sections 27 of the terminal portions 17a and the stepped sections 28 of the electrode terminals are subjected to a greater pressure than is exerted on those sandwiched between both of the main surfaces and are compressed to a diameter of roughly 1 μm or less. It should be noted that even in the case of the conductive particles 4 being destroyed by compression, size is generally 1 μm or less. The gap (c) between both of the stepped sections 27, 28 thus becomes 1 μm or less.

In contrast, in the case in which Formula (2) is not satisfied, distance is increased between both of the main surfaces of the terminal portions 17a and the electrode terminals 19 leading to the conductive particles 4 sandwiched between the main surfaces being compressed by less than 20% in which pressing is insufficient. Consequently, conduction between the terminal portions 17a and the electrode terminals 19 might be worsened.

Connecting Step

A connecting step for connecting the liquid crystal driver IC 18 to the transparent substrate 12 will now be described in detail. First, the anisotropic conductive film 1 is temporarily pasted onto the COG mounting portion 20 having the terminal portions 17 of the transparent substrate 12 formed thereon. Next, the transparent substrate 12 is placed on a stage of a connecting device and the liquid crystal driver IC 18 is positioned on the transparent substrate 12 with the anisotropic conductive film 1 interposing therebetween.

Next, by using a thermocompression head 33 heated to a predetermined temperature for curing the binder resin layer 3 at a predetermined pressure and time, the liquid crystal driver IC 18 is thermocompression-bonded from above. The binder resin layer 3 of the anisotropic conductive film 1 thus exhibits flowability, and, while the binder resin layer 3 flows from between the mounting surface 18a of the liquid crystal driver IC 18 and the COG mounting portion 20 of the transparent substrate 12, the conductive particles 4 within the binder resin layer 3 are sandwiched and deformed between the electrode terminals 19 of the electrode terminals 18 and the terminal portions 17a of the transparent substrate 12.

At this time, as described above, the conductive particles 4, and the stepped sections 27, 28 of the electrode terminals 19 and the terminal portions 17a which sandwich the conductive particles 4, satisfy Formula (1) as follows.

$$a+b+c \leq 0.8D \quad (1)$$

In Formula (1), a is a height of the stepped section of the electrode terminals 19, b is a height of the stepped section of the terminal portions 17a, c is a gap distance between each of the stepped sections and D is a diameter of the conductive particles.

Therefore, in the liquid crystal display panel 10, the conductive particles 4 sandwiched between both of the main surfaces of the terminal portions 17a and the electrode terminals 19 can be compressed to reduce diameter to at least 80%, thus enabling assurance of sufficient electrical conduction.

Particularly, in the liquid crystal display panel 10, in the case of using an anisotropic conductive film 1 having regularly arranged conductive particles filled at a high density to cope with finer pitches of the terminal portions 17a and the electrode terminals 19, a phenomenon can easily occur in which the conductive particles 4 are not only sandwiched between the main surfaces of the terminal portions 17a and the electrode terminals 19 but also clamped between the stepped sections 27, 28. Even in this case, by satisfying Formula (1), the conductive particles 4 sandwiched between the terminal portions 17a and the electrode terminals 19 can be compressed by 20% or more and an excellent conduction reliability can be ensured.

Consequently, the electrode terminals 19 and the terminal portions 17a are electrically connected by the conductive particles 4 being sandwiched therebetween and, in this state, heat is applied by a thermocompression head 33 to cure the binder resin. This enables manufacturing of the liquid crystal display panel 10 in which conduction is ensured between the electrode terminals 19 of the liquid crystal driver IC 18 and the terminal portions 17a of the transparent substrate 12.

The conductive particles 4 which are not between the electrode terminals 19 and the terminal portions 17a are dispersed within the binder resin in inter-terminal spaces between adjacent electrode terminals 19 and maintained in an electrically insulated state. Thus, electrical conduction only between the electrode terminals 19 of the liquid crystal driver IC 18 and the terminal portions 17a of the transparent substrate 12 is achievable. It should be noted that, as the binder resin, by using a fast curing type radical polymerization reaction type, it is possible to rapidly cure the binder resin with a short heating time. Additionally, the anisotropic conductive film 1 is not limited to thermosetting types and as long as pressure can be used in connection, a photosetting type or a thermo/photosetting type adhesive agent can be used.

EXAMPLES

Examples of the present disclosure will now be described. In the present examples, anisotropic conductive films in which conduction particles were regularly arranged were used to manufacture sample connecting bodies in which evaluation-use ICs were connected to evaluation-use glass substrates; compression ratios of the conductive particles trapped between each of the substrate electrodes formed on the evaluation-use substrates and the IC bumps formed on the evaluation-use ICs and either initial and post-reliability-test electrical resistances (Examples 1 to 6 and Comparative Examples 1 and 2) or short circuit occurrence rates of adjacent IC bumps (Example 7 and Comparative Example 3) were measured.

Anisotropic Conductive Film

In the binder resin layer of the anisotropic conductive films used to connect the evaluation-use ICs, 60 pts. mass of a phenoxy resin (trade name: YP-50, manufactured by NIPPON STEEL & SUMIKIN CHEMICAL CO., LTD.), 40 pts mass of an epoxy resin (trade name: jER828, manufactured by Mitsubishi Chemical Corporation) and 2 pts. mass of a cation-type curing agent (trade name: SI-60L, manufactured by SANSHIN CHEMICAL INDUSTRY CO., LTD.) were added to a solvent to prepare a binder resin composition, this binder resin composition was applied to release-treated films and baked.

Then, anisotropic conductive films were obtained by coating a pressure-sensitive adhesive agent onto stretchable sheets onto which the conductive particles were arranged in a single layer before stretching the sheets to a predetermined draw ratio and laminating the binder resin layer in this state.

It should be noted that the arrangement configuration of the conductive particles according to the present disclosure is not limited to those described in these examples.

Evaluation-Use IC

As evaluation devices for measuring electrical resistances, evaluation-use ICs having outer dimensions of 1.8× 20 mm, thickness of 0.5 mm, (Au-plated) bump width of 30 μm, bump length of 85 μm, bump height of 15 μm, and inter-bump space of 50 μm were used.

Evaluation-Use Glass Substrate

As the evaluation-use glass substrates to which the evaluation-use ICs for measuring electrical resistances were connected, a glass was used which had outer dimensions of 30×50 mm and a thickness of 0.5 mm and on which an ITO pattern was formed in a comb-like shape at a size and pitch equivalent to the bumps on the evaluation-use IC for measuring electrical resistances.

Evaluation-Use IC

As evaluation devices for measuring short circuit occurrence rates between adjacent IC bumps, evaluation-use ICs having outer dimensions of 1.5×13 mm, thickness of 0.5 mm; (Au-plated) bump width 25 μm, bump length of 140 μm, bump height 15 of μm and inter-bump space of 7.5 μm were used.

Evaluation-Use Glass Substrate

As evaluation-use glass substrates to which the evaluation-use ICs for measuring short circuit occurrence rates between adjacent IC bumps were connected, a glass was used which had outer dimensions of 30×50 mm and a thickness of 0.5 mm and on which an ITO pattern was formed in a comb-like shape at a size and pitch equivalent to the bumps on the evaluation-use ICs for measuring short circuit occurrence rates between adjacent IC bumps.

The anisotropic conductive films were temporarily pasted to these evaluation-use glass substrates before mounting and thermocompression bonding the evaluation-use ICs while keeping alignment between the substrate terminals and the IC bumps with a thermocompression head. In Examples 1 to 7 and Comparative Examples 1 and 3, thermocompression bonding was performed with conditions of 180° C., 80 MPa, and 5 seconds in order to manufacture sample connection bodies. In Example 2, thermocompression bonding was performed with conditions of 180° C., 40 MPa and 5 seconds in order to manufacture sample connection bodies. For each of the connection body samples, compression ratios of the conductive particles sandwiched between the IC bumps and the substrate electrodes and either initial and post-reliability-test electrical resistances or short circuit occurrence rates between adjacent IC bumps were measured. Conditions for the reliability test were 85° C., 85% RH, and 500 hours.

Example 1

In Example 1, conductive particles having a diameter of 4 μm were used in the anisotropic conductive film. Particle number density before connection was 28,000 particles/mm². Moreover, a height a of the stepped sections formed on the edge-side areas of the IC bumps had a height of 0.8 μm and height b of the stepped sections formed on the edge-side areas of the substrates had a height of 0.8 μm.

In the connection body samples of Example 1, the gap c between both of the stepped sections caused by clamping of the conductive particles between both stepped sections of the IC bumps and the substrate electrodes was 0.8 μm; the compression ratio of the conductive particles sandwiched between main surfaces on both sides of the IC bumps and the substrate electrode was 40% and post-reliability-test electrical resistance was 3Ω.

Example 2

In Example 2, conductive particles having a diameter of 3.5 μm were used in the anisotropic conductive film. Particle number density was 28,000 particles/mm². The height a, b of the stepped sections of IC bumps and the electrode were the same as in Example 1.

In the connection body samples of Example 2, the gap c between both of the stepped sections caused by clamping of the conductive particles between both stepped sections of the IC bumps and the substrate electrodes was 1.0 μm; the compression ratio of the conductive particles sandwiched between main surfaces on both sides of the IC bumps and the substrate electrode was 26% and post-reliability-test electrical resistance was 4Ω.

Example 3

In Example 3, conductive particles having a diameter of 3.0 μm were used in the anisotropic conductive film. Particle number density was 28,000 particles/mm². The height a, b of the stepped sections of IC bumps and the electrode were the same as in Example 1.

In the connection body samples of Example 3, the gap c between both of the stepped sections caused by clamping of the conductive particles between both stepped sections of the IC bumps and the substrate electrodes was 0.8 μm; the compression ratio of the conductive particles sandwiched between main surfaces on both sides of the IC bumps and the substrate electrode was 20% and post-reliability-test electrical resistance was 5Ω.

Example 4

In Example 4, conductive particles having a diameter of 3.5 μm were used in the anisotropic conductive film. Particle number density was 28,000 particles/mm². Moreover, a height a of the stepped sections formed on the edge-side areas of the IC bumps had a height of 0.8 μm and height b of the stepped sections formed on the edge-side areas of the substrates had a height of 1.2 μm.

In the connection body samples of Example 4, the gap c between both of the stepped sections caused by clamping of the conductive particles between both stepped sections of the IC bumps and the substrate electrodes was 0.8 μm; the compression ratio of the conductive particles sandwiched between main surfaces on both sides of the IC bumps and the substrate electrode was 20% and post-reliability-test electrical resistance was 5Ω.

Example 5

In Example 5, conductive particles having a diameter of 3.0 μm were used in the anisotropic conductive film. Particle number density was 28,000 particles/mm². The height a, b of the stepped sections of IC bumps and the electrode were the same as in Example 1.

In the connection body samples of Example 5, the gap c between both of the stepped sections was not caused by clamping of the conductive particles between both stepped sections of the IC bumps and the substrate electrodes and was 0.0 μm; the compression ratio of the conductive particles sandwiched between main surfaces on both sides of the IC bumps and the substrate electrode was 47% and post-reliability-test electrical resistance was 3Ω.

Example 6

In Example 6, conductive particles having a diameter of 3.0 μm were used in the anisotropic conductive film. Particle number density was 28,000 particles/mm². The height a, b of the stepped sections of IC bumps and the electrode were the same as in Example 1.

In the connection body samples of Example 6, by shifting of the edge-side are of the IC bumps and the opposing edge-side area of the substrate electrodes, the gap c of the stepped sections was 0.2 μm; the compression ratio of the conductive particles sandwiched between main surfaces on both sides of the IC bumps and the substrate electrode was 53% and post-reliability-test electrical resistance was 3Ω.

Example 7

In Example 7, conductive particles having a diameter of 4.0 μm were used in the anisotropic conductive film. Particle number density was 28,000 particles/mm². Moreover, a height a of the stepped sections formed on the edge-side areas of the IC bumps had a height of 0.8 μm and height b of the stepped sections formed on the edge-side areas of the substrates had a height of 1.4 μm.

In the connection body samples of Example 7, the gap c between both of the stepped sections caused by clamping of the conductive particles between both stepped sections of the IC bumps and the substrate electrodes was 1.0 μm; the compression ratio of the conductive particles sandwiched between main surfaces on both sides of the IC bumps and the substrate electrode was 20% and the short circuit occurrence rate between adjacent electrode terminals was 20 ppm.

Comparative Example 1

In Comparative Example 1, conductive particles having a diameter of 3.0 μm were used in the anisotropic conductive film. Particle number density was 28,000 particles/mm². Moreover, a height a of the stepped sections formed on the edge-side areas of the IC bumps had a height of 0.8 μm and height b of the stepped sections formed on the edge-side areas of the substrates had a height of 1.4 μm.

In the connection body samples of Comparative Example 1, the gap c between both of the stepped sections caused by clamping of the conductive particles between both stepped sections of the IC bumps and the substrate electrodes was 0.35 μm; the compression ratio of the conductive particles sandwiched between main surfaces on both sides of the IC bumps and the substrate electrode was 15% and post-reliability-test electrical resistance was 30Ω.

Comparative Example 2

In Comparative Example 2, conductive particles having a diameter of 4.0 μm were used in the anisotropic conductive film. Particle number density was 28,000 particles/mm². Moreover, a height a of the stepped sections formed on the edge-side areas of the IC bumps had a height of 0.8 μm and height b of the stepped sections formed on the edge-side areas of the substrates had a height of 0.8 μm.

In the connection body samples of Comparative Example 2, because the pressure applied by the thermocompression head was low at 40 MPa, the gap c between both of the stepped sections caused by clamping of the conductive particles between both stepped sections of the IC bumps and the substrate electrodes was 2.0 μm; the compression ratio of the conductive particles sandwiched between main surfaces on both sides of the IC bumps and the substrate electrode was 10% and post-reliability-test electrical resistance was 40Ω.

Comparative Example 3

In Comparative Example 3, conductive particles having a diameter of 4.0 μm were used in the anisotropic conductive film. Particle number density was 40,000 particles/mm². Moreover, a height a of the stepped sections formed on the edge-side areas of the IC bumps had a height of 0.8 μm and height b of the stepped sections formed on the edge-side areas of the substrates had a height of 1.4 μm.

In the connection body samples of Comparative Example 3, the gap c between both of the stepped sections caused by clamping of the conductive particles between both stepped sections of the IC bumps and the substrate electrodes was 1.1 μm; the compression ratio of the conductive particles sandwiched between main surfaces on both sides of the IC bumps and the substrate electrode was 17.5% and the short circuit occurrence rate between adjacent electrode terminals was 1000 ppm.

|  | Ex. 1 | Ex. 2 | Ex. 3 | Ex. 4 |
|---|---|---|---|---|
| Particle Number Density (particles/mm²) | 28000 | 28000 | 28000 | 28000 |
| Conductive Particle Diameter D (μm) | 4.0 | 3.5 | 3.0 | 3.5 |
| IC Bump Stepped Section Height a (μm) | 0.8 | 0.8 | 0.8 | 0.8 |
| Substrate Electrode Stepped Section Height b (μm) | 0.8 | 0.8 | 0.8 | 1.2 |
| Diameter of Particles Between Stepped Sections c (μm) | 0.8 | 1.0 | 0.8 | 0.8 |
| Conductive Particle Compression Amount (%) | 40 | 26 | 20 | 20 |
| Electrical Resistance (Ω) | 3 | 4 | 5 | 5 |

|  | Ex. 5 | Ex. 6 | Comp. 1 | Comp. 2 |
|---|---|---|---|---|
| Particle Number Density (particles/mm²) | 28000 | 28000 | 28000 | 28000 |
| Conductive Particle Diameter D (μm) | 3.0 | 3.0 | 3.0 | 4.0 |
| IC Bump Stepped Section Height a (μm) | 0.8 | 0.8 | 0.8 | 0.8 |
| Substrate Electrode Stepped Section Height b (μm) | 0.8 | 0.8 | 1.4 | 0.8 |
| Diameter of Particles Between Stepped Sections c (μm) | 0.0 | −0.2 | 0.35 | 2.0 |
| Conductive Particle Compression Amount (%) | 47 | 53 | 15 | 10 |
| Electrical Resistance (Ω) | 3 | 3 | 30 | 40 |

|  | Ex. 7 | Comp. 3 |
|---|---|---|
| Particle Number Density (particles/mm²) | 28000 | 40000 |
| Conductive Particle Diameter D (μm) | 4.0 | 4.0 |
| IC Bump Stepped Section Height a (μm) | 0.8 | 0.8 |
| Substrate Electrode Stepped Section Height b (μm) | 1.4 | 1.4 |
| Diameter of Particles Between Stepped Sections c (μm) | 1.0 | 1.1 |
| Conductive Particle Compression Amount (%) | 20 | 17.5 |
| Inter-Terminal Short Occurrence Rate (ppm) | 20 | 1000 |

As represented in Table 1, in Examples 1 to 6, the heights a of the stepped sections formed on edge-side areas of the IC bumps, the heights b of the stepped sections formed on edge-side areas of the substrate electrodes formed on the glass substrates and the gap c between the stepped sections on both sides of the IC bumps and the substrate electrodes added together to be the distances between the main surfaces of the IC bumps and the substrate electrodes was 80% or less of the diameter of the conductive particles. Therefore, in Examples 1 to 6, the conductive particles sandwiched between both of the main surfaces of the IC bumps and the substrate electrodes were compressed by 20% or more and it was possible to maintain excellent conduction reliability even after the reliability test.

In contrast, in Comparative Example 1, the distance between both main surfaces of the IC bumps and the substrate electrodes was large at 85% of the diameter of the conductive particles and the conductive particles were compressed by only 15%. Furthermore, in Comparative Example 2, the distance between both main surfaces of the IC bumps and the substrate electrodes was large at 90% of the diameter of the conductive particles and the conductive particles were compressed by only 10%. Consequently, in Comparative Example 1 and Comparative Example 2, compression of the conductive particles was inadequate, and conduction reliability was significantly adversely affected such that post-reliability-test electrical resistance was 30Ω or more.

Moreover, as represented in Table 2, in Example 7, number density of the conductive particles was 28,000 particles/mm²; in contrast, in Comparative Example 3, number density of the conductive particles was 40,000 particles/mm² such that the conductive particles were filled at a higher density. Consequently, in the connection body samples of Example 7, average inter-particle distance in spaces between IC bumps was 2 μm (0.5 times the particle diameter); in contrast, in the connection body samples of Comparative Example 3, average inter-particle distance in spaces between IC bumps was short at 1 μm (0.25 times the particle diameter). Furthermore, conductive particles clamped between both stepped sections of the IC bumps and the substrate electrodes also became continuous in Comparative Example 3 which had a significantly higher inter-terminal short circuit occurrence rate in comparison with Example 7.

REFERENCE SIGNS LIST

1 anisotropic conductive film, 2 release-treated film, 3 binder resin layer, 4 conductive particles, 6 winding reel, 10 liquid crystal display panel, 11, 12 transparent substrate, 12a edge area, 13 seal, 14 liquid crystal, 15 panel display unit, 16, 17 transparent electrodes, 17a terminal portion, 18 liquid crystal driver IC, 18a mounting surface, 19 electrode terminal, 20 COG mounting portion, 21 substrate-side alignment mark, 22 IC-side alignment mark, 23 protective film, 27, 28 stepped sections, 33 thermocompression head.

The invention claimed is:

1. A connection body comprising:
   a circuit substrate; and
   an electronic component connected onto the circuit substrate via an anisotropic conductive adhesive agent;
   wherein the circuit substrate has substrate electrodes formed thereon and the electronic component has electrode terminals formed thereon, both of which having stepped sections formed on respective edge-side areas;
   wherein conductive particles contained by the anisotropic conductive adhesive agent are sandwiched between main surfaces of the substrate electrodes and the electrode terminals; and
   wherein the conductive particles and each of the stepped sections of the substrate electrodes and the electrode terminals satisfy the following formula (1):

$$a+b+c \leq 0.8D \qquad (1)$$

wherein a is a height of the stepped section of the electrode terminals, b is a height of the stepped section of the substrate electrodes, c is a gap distance between each of the stepped sections and D is a diameter of the conductive particles.

2. The connection body according to claim 1, wherein the conductive particles and each of the stepped sections of the substrate electrodes and the electrode terminals satisfy the following formula (2):

$$c \leq 1\ \mu m \qquad (2).$$

3. The connection body according to claim 1, wherein the anisotropic conductive adhesive agent is formed in a film form, and wherein the conductive particles are regularly arranged or individually separated.

4. The connection body according to claim 1, wherein the conductive particles are sandwiched between the stepped sections formed on respective edge-side areas of the substrate electrodes and the electrode terminals.

5. A method for manufacturing a connection body comprising:
   a connecting step of connecting an electronic component onto a circuit substrate via an anisotropic conductive adhesive agent;
   wherein the circuit substrate has substrate electrodes formed thereon and the electronic component has electrode terminals formed thereon, both of which having stepped sections formed on respective edge-side areas;
   wherein conductive particles contained by the anisotropic conductive adhesive agent are sandwiched between main surfaces of the substrate electrodes and the electrode terminals; and
   wherein the conductive particles and each of the stepped sections of the substrate electrodes and the electrode terminals satisfy the following formula (1): $a+b+c \leq 0.8D$ (1)
   wherein a is a height of the stepped section of the electrode terminals, b is a height of the stepped section of the substrate electrodes, c is a gap distance between each of the stepped sections, and D is a diameter of the conductive particles.

6. An electronic device comprising a connection body, wherein the connection body is the connection body according to claim 1.

7. An electronic device comprising a connection body, wherein the connection body is the connection body according to claim 2.

8. An electronic device comprising a connection body, wherein the connection body is the connection body according to claim 3.

9. An electronic device comprising a connection body, wherein the connection body is the connection body according to claim 4.

10. The electronic device according to claim 6, wherein the electronic device is a display device.

11. The electronic device according to claim 7, wherein the electronic device is a display device.

12. The electronic device according to claim 8, wherein the electronic device is a display device.

13. The electronic device according to claim 9, wherein the electronic device is a display device.

* * * * *